United States Patent
Arakida et al.

(10) Patent No.: US 7,003,009 B2
(45) Date of Patent: Feb. 21, 2006

(54) SEMICONDUCTOR LASER DEVICE

(75) Inventors: Takahiro Arakida, Kanagawa (JP);
Hisashi Kudo, Miyagi (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/382,564

(22) Filed: Mar. 6, 2003

(65) Prior Publication Data

US 2003/0210722 A1     Nov. 13, 2003

(30) Foreign Application Priority Data

Mar. 11, 2002  (JP)  ............................. 2002-065174

(51) Int. Cl.
*H01S 5/00*        (2006.01)

(52) U.S. Cl. ................................. 372/49.01
(58) Field of Classification Search ................. 372/49, 372/49.01

See application file for complete search history.

(56) References Cited

U.S. PATENT DOCUMENTS 6,396,864 B1 *   5/2002  O'Brien et al.  ............... 372/49
6,438,150 B1 *   8/2002  Yoo  ........................ 372/49.01

FOREIGN PATENT DOCUMENTS

| JP | 06-224514 | 12/1994 |
| JP | 09-275239 | 10/1997 |
| JP | 09-326527 | 12/1997 |

* cited by examiner

*Primary Examiner*—James Menefee
(74) *Attorney, Agent, or Firm*—Robert J. Depke; Trexler, Bushnell, Giangiorgi, Blackstone & Marr, Ltd.

(57) ABSTRACT

An edge-emitting type 650 nm band red semiconductor laser device is provided, which includes a resonator structure having an active layer on a semiconductor substrate. A low reflection three-layer film is provided on an emitting edge face of the resonator structure and a high reflection multi-layer film is provided on a rear edge face of the resonator structure. The low reflection three-layer film is formed by sequentially stacking a first Al2O3 film having a thickness of 10 nm, a SiN4 film having a thickness of 190 nm, and a second Al2O3 film having a thickness of 10 nm on the emitting edge face by a sputtering process.

3 Claims, 2 Drawing Sheets

ADHERING PARTICLES

SEMICONDUCTOR LASER DEVICE

This application claims priority to Japanese Patent Application Number JP2002-065174 filed Mar. 11, 2002, which is incorporated herein by reference.

BACKGROUND OF THE INVENTION

The present invention relates to an edge-emitting semiconductor laser device, and particularly to a semiconductor laser device capable of realizing stable operation with a high output over a long period of time by suppressing degradation of an emitting edge face due to catastrophic optical damage.

In a GaAs based edge-emitting semiconductor laser device, there occurs a phenomenon that along with the increased injection current in order to enlarge an optical output, the optical output is rather abruptly decreased. This is due to catastrophic optical damage (COD) at an emitting edge face of the semiconductor laser device. It is known that such COD may occur on the basis of the following mechanism.

A high density surface level is present on an emitting edge face of a semiconductor laser device, and accordingly, when a current is injected in the semiconductor laser device, a non-radiative recombination current flows via the surface level. As a result, the carrier density near the emitting edge face becomes lower than that in the laser, to yield light absorption. The light absorption causes heat generation, to raise the temperature of a portion near the emitting edge face, so that a band gap energy near the emitting edge face is reduced, to further increase the optical absorption. The positive feedback loop associated with optical absorption and heat generation significantly raises the temperature of the emitting edge face, which finally leads to fusing of the emitting edge face, thereby stopping laser oscillation. It is also known that optical absorption may be increased by oxidation of the emitting edge face and occurrence of point-defects such as vacancies at the emitting edge face.

To prevent occurrence of such COD at an emitting edge face of a semiconductor laser device, a countermeasure has been made to output laser light from the emitting edge face as much as possible by forming a low reflection film on the emitting edge face.

Japanese Patent No. 2870486 (hereinafter, referred to as "first related art") discloses a semiconductor laser device, wherein a low reflection two-layer film having an $Al_2O_3$ film and an $Si_3N_4$ film is provided on en emitting edge face. This document describes that since the direction of the stress due to strain caused in the $Al_2O_3$ film is reversed to the direction of the stress due to strain caused in the $Si_3N_4$ film, the stress due to strain caused in the $Al_2O_3$ film is canceled by the stress due to strain caused in the $Si_3N_4$ film, to thereby eliminate the stress due to strain in the stacked film having the $Al_2O_3$ film and the $Si_3N_4$ film.

The above document further describes that since the stress due to strain caused in the emitting edge face of the semiconductor laser device can be reduced by providing the two-layer film having the $Al_2O_3$ film and the $Si_3N_4$ film on the emitting edge face, it is possible to suppress occurrence of point-defects such as vacancies due to strain caused by the stress at the emitting edge face, and hence to form a stable dielectric-compound semiconductor interface, thereby suppressing degradation of the emitting edge face due to COD.

Japanese Patent Laid-open No. Hei 6-224514 (hereinafter, referred to as "second related art") discloses a semiconductor laser device configured such that a two-layer film including an Si film having a relatively high thermal conductivity and an $Al_2O_3$ film having a relatively low thermal conductivity is provided as a high reflection coating film on a rear edge face of the semiconductor laser device, wherein the thermal conductivity of the entire high reflection coating film is increased by making the thickness of the $Al_2O_3$ film thinner than $\lambda/n_1$ ($\lambda$: wavelength, $n_1$: refractive index of $Al_2O_3$) and making the thickness of the Si film thicker than $\lambda/n_2$ ($\lambda$: wavelength, $n_2$: refractive index of Si), to improve the heat dissipation performance of the semiconductor laser device.

The above-described first related art, however, has the following problems.

The semiconductor laser device according to the first related art is intended to suppress degradation of the emitting edge face due to COD by canceling the stress due to strain caused in the emitting edge face by providing the stacked film having the $Al_2O_3$ film and the $Si_3N_4$ film thereon.

Accordingly, the thicknesses of the $Al_2O_3$ film and the $Si_3N_4$ film and the film formation conditions thereof are required to be set such that the edge reflectance against a specific emission wavelength becomes a specific value on the basis of a refractive index (n=1.6) of $Al_2O_3$ and a refractive index (n=2.1) of $Si_3N_4$, and that the stress due to strain caused in the emitting edge face is canceled.

In actual, however, it is very difficult to select the thicknesses of the $Al_2O_3$ layer and the $Si_3N_4$ layer and the film formation conditions thereof so as to satisfy both the edge reflectance and the canceling of the stress due to strain. An additional problem is that since the degree of freedom in film formation conditions of the $Al_2O_3$ layer and the $Si_3N_4$ layer is small, the film formation thereof is very difficult.

As a result, from the viewpoint of practical use, it is difficult to apply the first related art to a variety of semiconductor laser devices different from each other in terms of emission wavelength, edge reflectance, and application use.

The first related art has another problem that since $Si_3N_4$ poor in chemical and thermal stability is exposed, the resistance against chemicals at the subsequent processing steps, for example, a cleaning step becomes low, to degrade the fabrication yield, and the optical characteristic is varied depending on the progress of oxidation due to atmospheric air accompanied by drive of the semiconductor laser device.

A further important problem of the semiconductor laser device provided with the low reflection multi-layer film according to the first related art is that the laser characteristic is easy to be degraded, thereby making it difficult to realize stable operation over a long period of time.

The second related art, which is intended to provide the high reflection film on the rear edge face of the semiconductor laser device, is technically difficult to be applied to the emitting edge face of the semiconductor laser device.

If the second related art is applied to the emitting edge face, since the Si film causes optical absorption for light having a wavelength in a 0.8 $\mu$m band or less, the emission wavelength range of the semiconductor laser device to which the second related art is applied is limited.

SUMMARY OF THE INVENTION

An object of the present invention is to provide a semiconductor laser device capable of suppressing occurrence of catastrophic optical damage of an emitting edge face by providing a low reflection film having a good chemical and thermal stability and also having a wide applied wavelength range, thereby realizing stable operation over a long period of time.

The present inventor has examined the instability in operation of the semiconductor laser device according to the first related art, and found the following reason for this.

In the two-layer structure of $Al_2O_3/Si_3N_4$, the $Si_3N_4$ layer allowing particles to easily adhere thereon is exposed, with a result that a large number of particles may adhere on the $Si_3N_4$ layer at processing steps subsequent to the step of forming the two-layer structure, for example, at a step of cleaning the device or a step of fusing a laser bar obtained by cleavage on a heat sink and dicing the laser bar into chips.

The particles adhering on the $Si_3N_4$ layer may interfere with laser light emitted from the emitting edge face, and in some cases, the particles absorb the laser light to cause heat generation, to degrade the laser characteristic, thereby obstructing stable operation of the semiconductor laser device.

As described above, degradation of an emitting edge face due to COD is caused by the fact that the temperature of the emitting edge face is raised as a result of reduction in carrier density at the emitting edge face and the optical absorption caused associated therewith.

Accordingly, in order to suppress degradation of an emitting edge face due to COD, a manner to increase the thermal conductivity of a low reflection film formed by a dielectric film, to improve the heat dissipation characteristic, thereby suppressing a local temperature rise may be considered to be more effective than the first related art intended to suppress degradation of the emitting edge face due to COD by canceling the stress due to strain at the emitting edge face.

As a result of examination by the present inventor to develop a new low reflection film to be provided on an emitting edge face of a semiconductor laser device, it has been found that the thermal conductivity of a low reflection film can be improved by forming, on the basis of the fact that a single $Al_2O_3$ film is generally used as a low reflection coating film having a reflectance of 35% or less, the $Al_2O_3$ film as a basic low reflection coating film, and stacking a dielectric film having a thermal conductivity higher than that of the $Al_2O_3$ film, such as a $Si_3N_4$ film, on the $Al_2O_3$ film for improving the thermal conductivity of the $Al_2O_3$ film. It is also found that the use of the $Al_2O_3$ film as a first film on an emitting edge face is effective because the $Al_2O_3$ film has a high adhesive force to the edge face of a resonator, a transmittance in a wide wavelength range, a chemical and thermal stability, and a non-affinity property with a compound semiconductor crystal.

The present inventor has further examined to eliminate the above-described inconvenience that if the $Si_3N_4$ film is exposed, particles are liable to adhere thereon, to degrade the resistance against chemicals and the chemical and thermal stability, and found that it is advantageous to stack an $Al_2O_3$ film on the $Si_3N_4$ film as a protective film.

The effectiveness of the above-described low reflection film has been experimentally confirmed by the present inventor, followed by further improvement of characteristics of the low reflection film, and on the basis of such knowledge, the present invention has been accomplished.

To achieve the above object, according to the present invention, there is provided a semiconductor laser device of an edge-emitting type including a resonator having a pair of edge faces, on one emitting edge face of which a low reflection multi-layer film is provided, wherein the low reflection multi-layer film includes a first dielectric film, a second dielectric film having a thermal conductivity higher than that of the first dielectric film, and a third dielectric film having a thermal conductivity lower than that of the second dielectric film.

In the low reflection multi-layer film, the first dielectric film functions as a low reflection film, and the second dielectric film having a thermal conductivity higher than that of the first dielectric film functions as a thermal conductive film, whereby heat generated from the emitting edge face is transmitted to the second dielectric film via the first dielectric film, to be released by way of the second dielectric film.

The third dielectric film functions as a protective film for the second dielectric film, to prevent adhesion of particles on the second dielectric film or damage of the second dielectric film at the subsequent processing step such as a cleaning step.

With this configuration, the edge reflectance of the emitting edge face can be reduced to a value of 35% or less, and further to 10% or less.

The first dielectric film is preferably made from one kind selected from a group consisting of $Al_2O_3$, $ZrO_2$, $HfO_2$, and AlN.

The second dielectric film is preferably made from one kind selected from a group consisting of $Si_3N_4$, AlN, GaN, and SiC.

The third dielectric film is preferably made from one kind selected from a group consisting of $Al_2O_3$, $ZrO_2$, $HfO_2$, and $SiO_2$.

It is to be noted that the material of the third dielectric film may be identical to or different from that of the first dielectric film, and that the thickness of the third dielectric film may be identical to or different from that of the first dielectric film.

According to the present invention, unlike the first related art, it is not required to reduce the stress caused at an emitting edge face by providing a low reflection multi-layer film provided at the emitting edge face, and accordingly, it is not required to set the thicknesses of the first dielectric film such as an $Al_2O_3$ film and the second dielectric film such as an $Si_3N_4$ film and the film formation conditions thereof in such a manner that the edge reflectance becomes a specific value and the stress due to strain caused at the emitting edge face is canceled.

According to the present invention, by making use of the fact that the edge reflectance of a dielectric film is periodically changed along with a change in thickness of the dielectric film, that is, the thickness of the dielectric film exhibiting a specific edge reflectance is stepwise changed in a range from a thin value to a thick value, the thickness of the second dielectric film having a thermal conductivity higher than the first dielectric film such as an $Al_2O_3$ film can be selected from a plurality of stepwise changed values in such a manner that the edge reflectance of the low reflectance three-layer film becomes a specific value.

As a result, the thickness of the second dielectric film can be easily selected under the consideration of the thermal conductivity while keeping a specific edge reflectance of the low reflectance three-layer film. For example, by setting the thickness of each of the first and third dielectric films such as the $Al_2O_3$ films having a low thermal conductivity to 10 nm and setting the second dielectric film having a high thermal conductivity to a thick value, it is possible to obtain a low reflectance three-layer film having a specific edge reflectance and also having a high thermal conductivity as a whole.

The present invention is applicable to various semiconductor laser devices without any limitation to kinds of substrates, and compositions of compound semiconductor layers constituting resonator structures to be formed on the substrates, and particularly, suitably applicable to a GaAs, AlGaAs, and AlGaInP based semiconductor laser devices.

The present invention is also applicable to various semiconductor laser devices without any limitation to configurations of laser stripes such as a buried type or an air ridge type.

The present invention is further applicable to various edge emitting semiconductor laser devices for emission of light in a wide emission wavelength range, for example, in a 400 nm band, a 650 nm band, a 780 nm band, a 850 nm band, a 980 nm band, and the like.

To improve the thermal conductivity of the entire low reflection three-layer film, the thickness of each of the first and third dielectric films, which has a low thermal conductivity, is preferably made as thin as possible.

The first dielectric film, however, must have a thickness required to perfectly cover the emitting edge face so as to prevent occurrence of any pin hole. In this regard, the thickness of the first dielectric film (particularly, when the first dielectric film is configured as an $Al_2O_3$ film) is preferred to be in a range of 5 nm or more.

The third dielectric film also must have a thickness required to exhibit a resistance against chemicals and suppress the progress of oxidation due to atmospheric air as a surface protective layer. In this regard, the thickness of the third dielectric film (particularly, when the third dielectric film is configured as an $Al_2O_3$ film) is preferred to be in a range of 5 nm or more.

After the kinds and thicknesses of the first and third dielectric films are determined, the kind of the second dielectric film is determined and then the thickness of the second dielectric film may be selected, under the consideration of the thermal conductivity, from a plurality of thicknesses stepwise changed from a thin value to a thick value while keeping a specific edge reflectance. As a result, it is possible to obtain a low reflection three-layer film having a good thermal conductivity while keeping a specific edge reflectance.

According to the present invention, since it is not required to cancel the stress due to strain caused at an emitting edge face as in the first related art, the film formation conditions can be freely set.

According to the present invention, as described above, by making use of the fact that the edge reflectance of a dielectric film is periodically changed along with a change in thickness of the dielectric film, it is possible to freely change the thicknesses of the first dielectric film, the second dielectric film having a thermal conductivity higher than that of the first dielectric film, and the third dielectric film, which constitute the low reflection three-layer film.

After a specific edge reflectance of the low reflection three-layer film is set, the thicknesses of the first and third dielectric films may be first determined, and then the thickness of the second dielectric film such as an $Si_3N_4$ film having a high thermal conductivity may be selected, under the consideration of the thermal conductivity, from a plurality of thicknesses stepwise changed from a thin value to a thick value while keeping the specific edge reflectance.

According to the present invention, the thickness of the first dielectric film may be in a range of 5 nm to 100 nm, and the thickness of the second dielectric film may be in a range of 50 nm to 400 nm.

For example, an $Al_2O_3$ film having a thickness in a range of 5 nm to 100 nm may be used as the first dielectric film, and an $Si_3N_4$ film having a thickness in a range of 50 nm to 400 nm may be used as the second dielectric film.

The reason why the thickness of the $Al_2O_3$ film used as the first dielectric film is set in the range of 100 nm or less is that if the thickness of the $Al_2O_3$ film becomes equal to or more than 100 nm, the thermal conductivity of the first dielectric becomes low, and the reason why the thickness of the $Si_3N_4$ as the second dielectric film is set in the range of 400 nm or less is that even if the thickness of the $Si_3N_4$ film becomes more than 400 nm, the thermal conductivity thereof is not correspondingly increased.

According to the present invention, the first, second, and third dielectric films can be formed by the known film formation process such as a sputtering process, a CVD process, or an EB vapor-deposition process. In particular, the sputtering process is preferable because such a process is excellent in controllability of the film thickness.

BRIEF DESCRIPTION OF THE DRAWINGS

The above and other objects and features of the present invention will be more apparent from the following detailed description taken in conjunction with the accompanying drawings, in which.

DETAILED DESCRIPTION OF THE PREFERRED EMBODIMENT

Hereinafter, a preferred embodiment of the present invention will be described in detail with reference to the accompanying drawings.

Figure 1A:
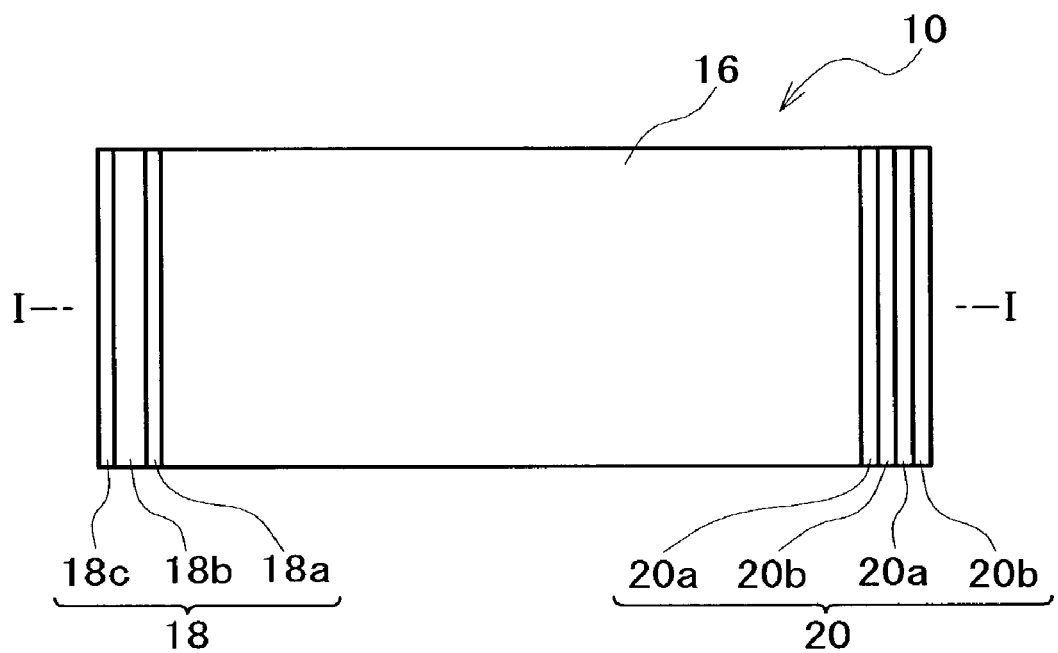
FIG. 1A is a typical plan view of a semiconductor laser device according to an embodiment of the present invention, showing a configuration of a low reflection three-layer film formed on an emitting edge face of the semiconductor laser device and a high reflection multi-layer film formed on a rear edge face of the semiconductor laser device.
Figure 1B:
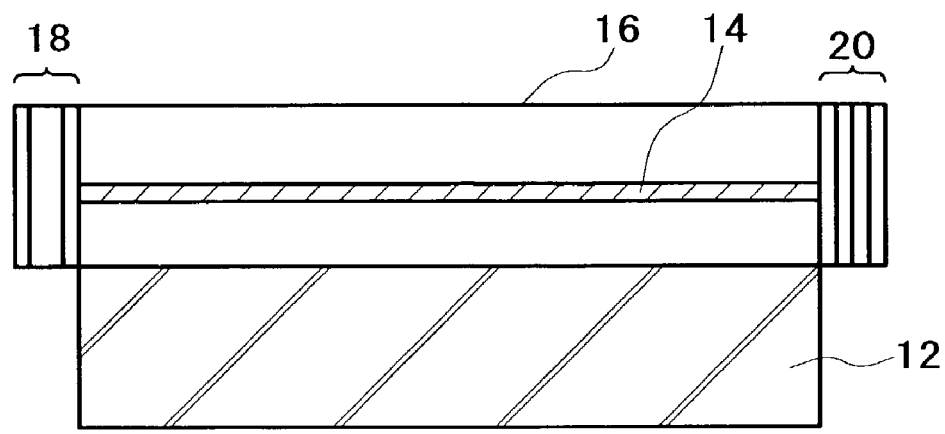
FIG. 1B is a sectional view taken in line I—I of FIG. 1A.

FIGS. 1A and 1B are views showing a semiconductor laser device according to this embodiment of the present invention, wherein FIG. 1A is a typical plan view showing a configuration of a low reflection three-layer film formed on an emitting edge face of the semiconductor laser device and a high reflection multi-layer film formed on a rear edge face of the semiconductor laser device, and FIG. 1B is a sectional view taken on line I—I of FIG. 1A.

Referring to these figures, there is shown a semiconductor laser device 10, which is configured as an edge-emitting type 650 nm band red semiconductor laser device. The semiconductor laser device 10 includes a resonator structure 16 having an active layer 14 on a compound semiconductor substrate 12 made from GaAs. A low reflection three-layer film 18 is formed on an emitting edge face of the resonator structure and a high reflection multi-layer film 20 is formed on a rear edge face of the resonator structure.

The high reflection multi-layer film 20 is formed by alternatively stacking $Al_2O_3$ films 20a and a-Si (amorphous silicon) films 20b on the rear edge face of the resonator structure.

The low reflection three-layer film 18 is formed by sequentially stacking a first $Al_2O_3$ film 18a, an $Si_3N_4$ film 18b, and a second $Al_2O_3$ film 18c on the emitting edge face of the resonator structure by a sputtering process. The edge reflectance of the low reflection three-layer film 18 is set to 10%. It is to be noted that the first $Al_2O_3$ film 18a, the $Si_3N_4$ film 18b, and the second $Al_2O_3$ film 18c function as a first dielectric film, a second dielectric film, and a third dielectric film defined according to the present invention, respectively.

To increase the thermal conductivity of the entire low reflection three-layer film 18, it is preferred to make the first $Al_2O_3$ film 18a and the second $Al_2O_3$ film 18c, each of which has a low thermal conductivity, as thin as possible.

The first $Al_2O_3$ film 18a, however, must have a thickness required to perfectly cover the emitting edge face so as to prevent occurrence of any pin hole. From this viewpoint, the thickness of the first $Al_2O_3$ film 18a is preferably set in a range of 5 nm or more, and in this embodiment, set to 10 nm.

The second $Al_2O_3$ film 18c also must have a thickness required to exhibit a resistance against chemicals as a surface protective layer of the low reflection three-layer film 18 and to suppress the progress of oxidation due to atmospheric air. From this viewpoint, the thickness of the second $Al_2O_3$ film 18c is preferably set in a range of 10 nm or more, and in this embodiment, set to 10 nm.

The edge reflectance of a dielectric film is periodically changed along with a change in thickness of the dielectric film. Accordingly, even if the edge reflectance is set to 10%, the thicknesses of the first $Al_2O_3$ 18a, the $Si_3N_4$ film 18b, and the second $Al_2O_3$ film 18c of the low reflection three-layer film 18 can be freely changed.

As one example, in the case of setting the edge reflectance of the low reflection three-layer film 18 to 10%, if the thickness of each of the first and second $Al_2O_3$ films 18a and 18c is set to 10 nm, the thickness of the $Si_3N_4$ film 18b allowing the edge reflectance of the low reflection three-layer film 18 to be kept at 10% becomes either of 36 nm, 85 nm, 190 nm, 240 nm, . . . on the basis of a relationship associated with a periodical change in edge reflectance along with a change in thickness of the dielectric film, and therefore, the thickness of the $Si_3N_4$ film 18b can be selected as one of 36 nm, 85 nm, 190 nm, 240 nm, . . . such that the $Si_3N_4$ film 18b having such a selected thickness exhibits the most desirable thermal conductivity. As another example, in the case of setting the edge reflectance to 10%, if the thickness of each of the first and second $Al_2O_3$ films 18a and 18c is set to 50 nm, the thickness of the $Si_3N_4$ film 18b allowing the edge reflectance of the low reflection three-layer film 18 to be kept at 10% becomes either of 27 nm, 137 nm, 182 nm, 292 nm, . . . on the above-description relationship, and therefore, the thickness of the $Si_3N_4$ film 18b can be selected as one of 27 nm, 137 nm, 182 nm, 292 nm, . . . such that the $Si_3N_4$ film 18b having such a selected thickness exhibits the most desirable thermal conductivity.

To increase the thermal conductivity of the entire low reflection film 18, the thickness of the $Si_3N_4$ film 18b is preferred to be in a range of 50 nm or more, and therefore, according to this embodiment in which the thickness of each of the first and second $Al_2O_3$ films 18a and 18c is set to 10 nm, the thickness of the $Si_3N_4$ film 18b may be selected as either of 36 nm, 85 nm, 190 nm, 240 nm, . . . , and in this embodiment, set to 190 nm.

The semiconductor laser device 10 according to this embodiment can be fabricated by a method of forming a resonator structure on a substrate by known processes such as an epitaxy process, an etching process, and an electrode formation process; cutting the resonator structure into a specific length by cleavage, to form a laser bar; forming a low reflection three-layer film 18 and a high reflection multi-layer film 20 on an emitting edge face and a rear edge face of the laser bar respectively by a sputtering process, CVD process, EB vapor-deposition process, or the like; and dicing the laser bar into chips.

In the semiconductor laser device 10 according to this embodiment, the low reflection three-layer film 18 having the first $Al_2O_3$ film 18a as the first dielectric film, the $Si_3N_4$ film 18b having a thermal conductivity higher than that of the $Al_2O_3$ film as the second dielectric film, and the second $Al_2O_3$ film 18c as the third dielectric film is provided on one emitting edge face of the edge faces of the resonator. As a result, the semiconductor laser device 10 is capable of suppressing degradation of the emitting edge face due to catastrophic optical damage (COD) caused at the time of high output operation, thereby realizing stable operation over a long period of time.

The semiconductor laser device 10 according to this embodiment has another advantage that since the emitting edge face is covered with the second $Al_2O_3$ film 18c having a good chemical and thermal stability, it is possible to prevent the emitting edge face from being damaged at a chemical cleaning step, a thermal processing step, and the like subsequent to the step of forming the low reflection three-layer film.

Figure 2B:
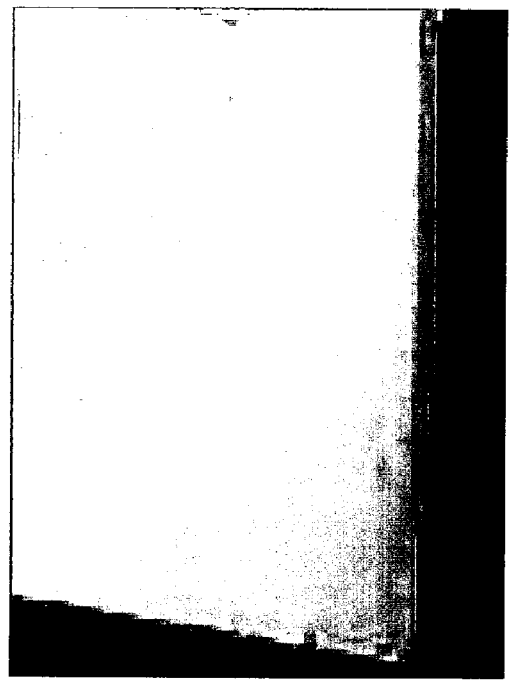
FIG. 2B shows an LD edge face provided with an $Al_2O_3/Si_3N_4/Al_2O_3$ film ($Al_2O_3$ layer: outermost surface side) according to the present invention.
Figure 2A:
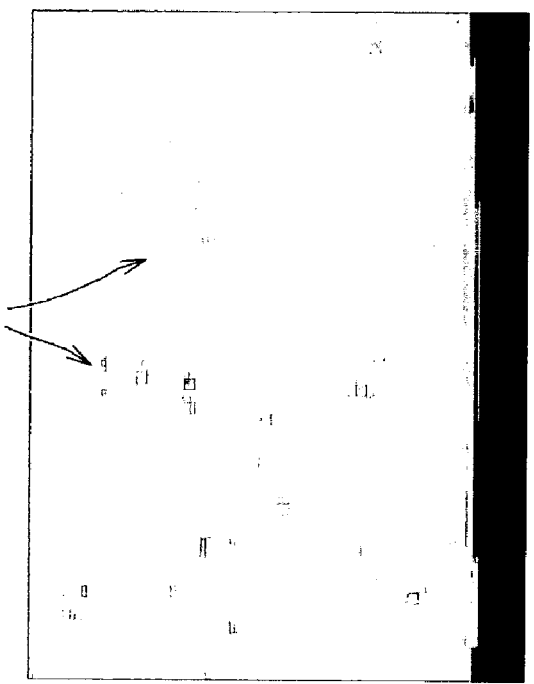
FIG. 2A shows an LD edge face provided with an $Al_2O_3/Si_3N_4$ film ($Si_3N_4$ layer: outermost surface side) according to the related art.

As shown in FIGS. 2A and 2B, the semiconductor laser device 10 is also advantageous in preventing adhesion of particles on the emitting edge face at an assembling step, thereby improving the yield of the semiconductor laser device 10.

FIGS. 2A and 2B are micrographs each showing an LD edge face after an assembling step, wherein FIG. 2A shows an LD edge face provided with an $Al_2O_3/Si_3N_4$ film ($Si_3N_4$ layer: outermost surface side) according to the related art, and FIG. 2B shows an LD edge face provided with an $Al_2O_3/Si_3N_4/Al_2O_3$ film ($Al_2O_3$ layer: outermost surface side) according to the present invention.

As is apparent from these micrographs, a large number of cutting particles having occurred at the step of dicing a heat sink adhere on the LD edge face provided with the film of the $Al_2O_3/Si_3N_4$ structure according to the related art, whereas any particles having occurred at the same step do not adhere on the LD edge face provided with the film of the $Al_2O_3/Si_3N_4/Al_2O_3$ structure according to the present invention. Accordingly, the semiconductor laser device including the LD edge face provided with the film of the $Al_2O_3/Si_3N_4/Al_2O_3$ structure is advantageous in improving the yield thereof and also suppressing degradation of characteristics due to adhesion of particles.

In this embodiment, the $Si_3N_4$ film is used as the second dielectric film having a thermal conductivity higher than that of the $Al_2O_3$ film as each of the first and third dielectric films; however, according to the present invention, the $Si_3N_4$ film may be replaced with either of an AlN film, a GaN film, and an SiC film. In the case of forming the second dielectric film by using a material other then $Si_3N_4$, the thickness of each of the $Al_2O_3$ films as the first and third dielectric films and the thickness of the second dielectric film made from the material other than $Si_3N_4$ may be set in such a manner as to obtain a specific edge reflectance and a specific thermal conductivity in the same manner as that described above. Each of the first and second $Al_2O_3$ films may be also replaced with either of a $ZrO_2$ film, an $HfO_2$ film, and AlN film.

In this embodiment, the present invention is applied to the edge-emitting type 650 nm band red semiconductor laser device; however, the present invention may be applied to another edge-emitting semiconductor laser device for emission of light of a wavelength in a wavelength band different from the 650 nm band.

While the preferred embodiment of the present invention has been described using the specific terms, such description is for illustrative purposes only, and it is to be understood that changes and variations may be made without departing from the spirit or scope of the following claims.

What is claimed is:

1. A semiconductor laser device of an edge-emitting type comprising:
   a resonator having a pair of edge faces, one emitting edge face at which a low reflection multi-layer film is provided;
   wherein said low reflection multi-layer film includes a first dielectric film formed over the emitting edge face of the resonator, a second dielectric film formed over the first dielectric film and having a thermal conductivity higher than that of said first dielectric film, and a third dielectric film formed over the second dielectric film and having a thermal conductivity lower than that of said second dielectric film, wherein said first dielectric film is comprised of $ZrO2$, $HfO2$, or AlN and said second dielectric film is comprised of AlN or GaN.

2. A semiconductor laser device according to claim 1, wherein said third dielectric film is comprised of $Al_2O_3$.

3. A semiconductor laser device according to claim 1, wherein said first dielectric film has a thickness ranging from 5 nm to 100 nm, and said second dielectric film has a thickness ranging from 50 nm to 400 nm.

* * * * *